(12) United States Patent
Weber et al.

(10) Patent No.: US 9,562,767 B2
(45) Date of Patent: Feb. 7, 2017

(54) SYSTEMS AND METHODS FOR IMPROVING MEMS GYROSCOPE START TIME

(71) Applicant: Honeywell International Inc., Morristown, NJ (US)

(72) Inventors: Mark W. Weber, Coon Rapids, MN (US); Dang Tu Van-Cao, Champlin, MN (US); Marie Annette Cox, Andover, MN (US); Douglas Campbell MacGugan, Bellevue, WA (US)

(73) Assignee: Honeywell International Inc., Morris Plains, NJ (US)

( * ) Notice: Subject to any disclaimer, the term of this patent is extended or adjusted under 35 U.S.C. 154(b) by 175 days.

(21) Appl. No.: 14/458,029

(22) Filed: Aug. 12, 2014

(65) Prior Publication Data

US 2016/0046485 A1    Feb. 18, 2016

(51) Int. Cl.
| | |
|---|---|
| *G01C 19/00* | (2013.01) |
| *G01C 19/5712* | (2012.01) |
| *B81C 1/00* | (2006.01) |
| *B81B 7/02* | (2006.01) |
| *G01C 19/5776* | (2012.01) |

(52) U.S. Cl.
CPC ............ *G01C 19/5712* (2013.01); *B81B 7/02* (2013.01); *B81C 1/00301* (2013.01); *G01C 19/5776* (2013.01); *B81C 2203/0792* (2013.01)

(58) Field of Classification Search
CPC ............ G01C 19/5614; G01C 19/5649; G01C 19/5712; G01C 19/5726; G01C 19/5776
USPC ........................................ 73/504.04, 504.12
See application file for complete search history.

(56) References Cited

U.S. PATENT DOCUMENTS

| | | |
|---|---|---|
| 5,747,961 A | 5/1998 | Ward et al. |
| 5,911,156 A | 6/1999 | Ward et al. |
| 6,064,169 A | 5/2000 | Ward et al. |

(Continued)

FOREIGN PATENT DOCUMENTS

| | | |
|---|---|---|
| EP | 2090868 | 8/2009 |
| EP | 2108964 | 10/2009 |

OTHER PUBLICATIONS

European Patent Office, "Extended European Search Report from EP Application No. 15179588.7 mailed Feb. 17, 2016", "from Foreign Counterpart of U.S. Appl. No. 14/458,029", Feb. 17, 2016, pp. 1-11, Published in: EP.

(Continued)

*Primary Examiner* — Benjamin Schmitt
(74) *Attorney, Agent, or Firm* — Fogg and Powers LLC

(57) ABSTRACT

Systems and methods for improving MEMS gyroscope start time are provided. In one embodiment, a circuit board for a MEMS gyroscope system comprises: a proof mass assembly; a proof mass control loop coupled to the proof mass assembly by a first proof mass motion sensor pickup line and a second proof mass motion sensor pickup line, where the proof mass control loop generates a set of drive signals that operate the proof mass assembly using a first capacitive signal from the first proof mass motion sensor pickup line and a second capacitive signal from the second proof mass motion sensor pickup line; and a tunable capacitive coupler connected to at least one of the first or the second proof mass motion sensor pickup lines, where the tunable capacitive coupler varies at least one of the first and second charge signals as a function of the drive signals.

13 Claims, 3 Drawing Sheets

(56) References Cited

U.S. PATENT DOCUMENTS

| | | | |
|---|---|---|---|
| 6,769,304 | B2 | 8/2004 | Platt et al. |
| 6,792,802 | B2 | 9/2004 | Platt |
| 6,981,415 | B2 | 1/2006 | Platt et al. |
| 2009/0255336 | A1* | 10/2009 | Horning ............. G01C 19/5719 73/504.12 |
| 2010/0259318 | A1 | 10/2010 | Bien et al. |
| 2012/0312095 | A1 | 12/2012 | Hanson et al. |

OTHER PUBLICATIONS

"The Draper Technology Digest", "CSDL-R-3009", 2007, pp. 1-92, vol. 11, Publisher: The Charles Stark Draper Laboratory Inc., Published in: Cambridge, MA.

Kanso et al., "Cross-Coupling Errors of Micromachined Gyroscopes", "Journal of Microelectromechanical Systems", Apr. 2004, pp. 323-331, vol. 13, No. 2, Publisher: IEEE.

Xia et al., "The Development of Micromachined Gyroscope Structure and Circuitry Technology", "Sensors 2014", Jan. 14, 2014, pp. 1394-1473, vol. 14.

* cited by examiner

SYSTEMS AND METHODS FOR IMPROVING MEMS GYROSCOPE START TIME

BACKGROUND

In micro-electromechanical (MEMS) device gyroscopes, proof masses are oscillated to vibrate at a resonance frequency. The oscillations are locked to the resonance frequency by a control loop that senses motion of the proof masses and provides a feedback signal to a set of drive electrodes. One challenge in working with MEMS gyroscopes is developing devices that have fast start times. That is, when a MEMS gyroscope is first started, the proof masses are not operating and therefore there is no signal into the control loop that regulates the drive electrodes. But as the proof masses continue to be driven, a small signal will begin to develop. During the initial stages of startup, this signal is very small in magnitude and easily masked by higher magnitude noise on the pickup lines that senses motion of the proof masses. This noise on the pickup lines enters the control loop and results in an erroneous feedback signal to the drive electrodes, increasing the amount of time necessary for the proof masses to reach their operating resonance frequency.

One significant source of noise which can masks the true proof mass motion signals is parasitic coupling between circuit board traces carrying the drive signals to the drive electrodes and the pickup traces carrying sensed motion signals to the control loop. Modeling and simulation of circuit board layouts can go a long way towards designing circuit boards for MEMS devices that either reduce, or at least balance, coupling between device components. However, such models for MEMS devices are inherently limited in their ability to accurately predict coupling in fabricated MEMS devices. Further, device fabrication vendors are inherently limited to manufacturing tolerances which can introduce unknowns not easily accounted for through pre-fabrication modeling.

For the reasons stated above and for other reasons stated below which will become apparent to those skilled in the art upon reading and understanding the specification, there is a need in the art for systems and methods for improving MEMS gyroscope start time delays.

SUMMARY

The Embodiments of the present invention provide methods and systems for systems and methods for improving MEMS gyroscope start time delays and will be understood by reading and studying the following specification.

Systems and methods for improving MEMS gyroscope start time are provided. In one embodiment, a circuit board for a micro-electromechanical (MEMS) gyroscope system is provided, the circuit board comprising: a proof mass assembly; a proof mass control loop coupled to the proof mass assembly by a first proof mass motion sensor pickup line and a second proof mass motion sensor pickup line, where the proof mass control loop generates a set of drive signals that operate the proof mass assembly using a first capacitive signal from the first proof mass motion sensor pickup line and a second capacitive signal from the second proof mass motion sensor pickup line; and a tunable capacitive coupler connected to at least one of the first proof mass motion sensor pickup line and the second proof mass motion sensor pickup line, where the tunable capacitive coupler varies at least one of the first and second charge signals as a function of the set of drive signals.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present disclosure address the issue of delayed start times in MEMS gyroscopes by integrating into a circuit board a post fabrication tunable balance coupling mechanism that introduces a coupling that will counter parasitic coupling between drive signals and proof mass motion pickup signals. More specifically, during fabrication, a pair of coupling receptor traces are stubbed off proof mass motion sensor pickup lines that provide input to the proof mass driver motor control loop. In one embodiment, one coupling receptor trace is paired with each polarity of the pickup lines so that the motor drive output signal is intentionally coupled onto both of the two coupling receptor traces as a feedback coupling. After fabrication of the circuit board that includes these coupling receptor traces, the board may be analyzed to determine the magnitude of parasitic couple still entering the control loop. From the analysis, the relative lengths of the two coupling receptor traces can be adjusted to further counter any parasitic coupling found during the analysis. That is, by adjusting the length of one of the two coupling receptor traces relative to the other, the feedback coupling applied into each of the pickup lines into the control loop can be adjusted to counter the noise introduced into the control loop by parasitic coupling. With noise from this source of parasitic noise effectively minimized, the control loop will operate on an input that more closely represents the actual motion of the proof masses for developing a control signal to drive the proof mass drive signals. As a result, the MEMS gyroscope proof masses will more quickly converge on their operating frequency.

Figure 1:
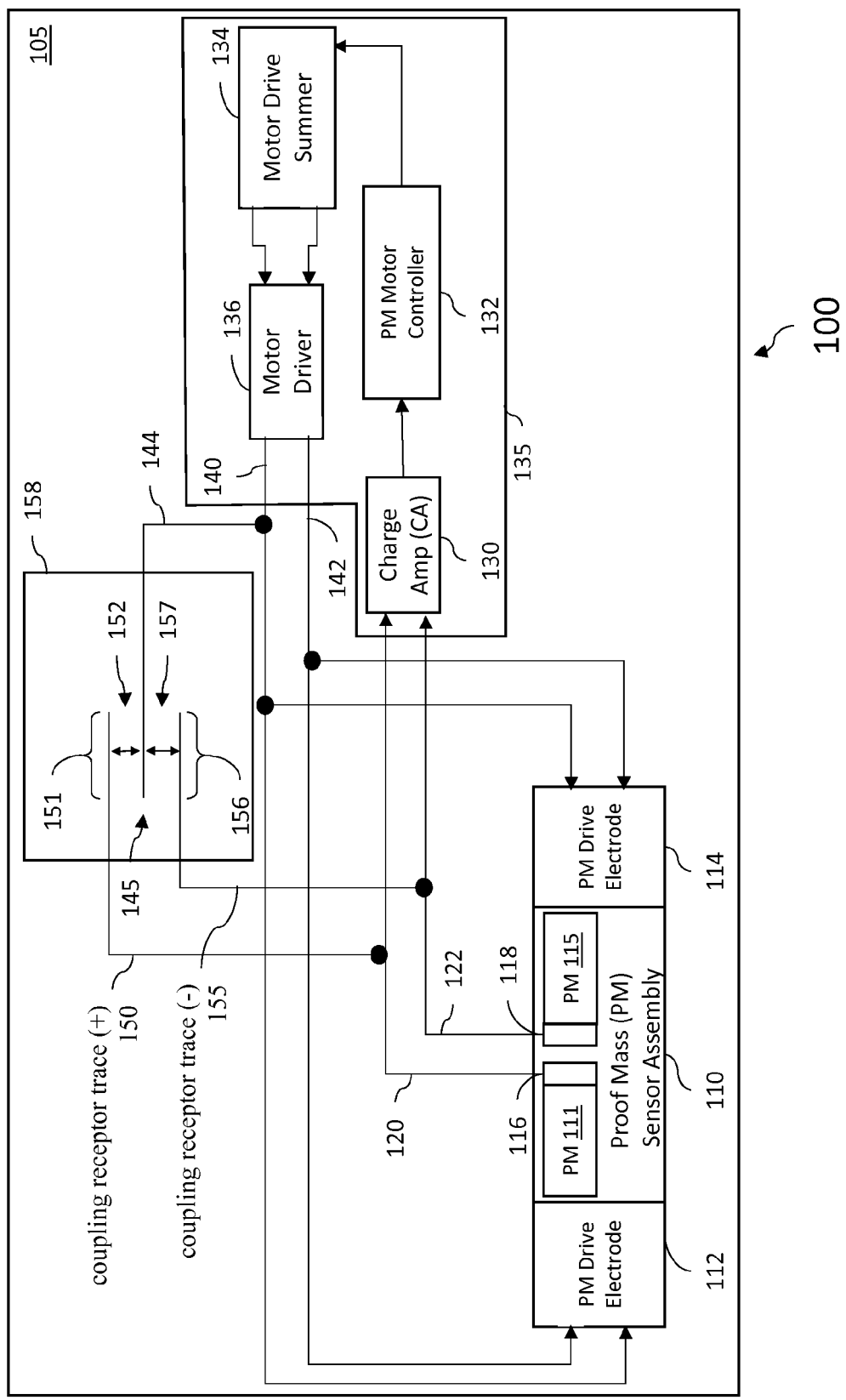
FIG. 1 is a block diagram illustrating a system of one embodiment of the present disclosure.

FIG. 1 is a diagram illustrating a MEMS gyroscope 100 of one embodiment of the present invention. MEMS gyroscope 100 includes a Proof Mass (PM) Sensor Assembly 110 that comprises proof masses 111 and 115, a set of PM drive electrodes 112 and 114 and a set of PM Motion Pickups 116 and 118. In operation, proof masses 111 and 115 are oscillated to vibrate at a resonance frequency controlled by mechanical properties. In the embodiment shown in FIG. 1, proof mass 111 is oscillated by drive electrode 112 while proof mass 115 is oscillated by drive electrode 114. These oscillations are locked to the resonance frequency, ω by a control loop 135 that senses motion of the proof masses 111 and 115 from respective proof mass motion sensor pickup lines 120, 122 and provides voltage signals 140, 142 that drive the drive electrodes 112, 114. More specifically, in the embodiments shown in FIG. 1, motion of proof mass 111 is sensed by PM motion pickup 116 while motion of proof mass 115 is sensed by PM motion pickup 118. In alternate embodiments, PM motion pickups 116 and 118 may be implemented in various ways using sense combs, electrode plates, or other similar device that detect and measure motion by sensing changes in charge or capacitance.

Control loop 135 includes a charge amplifier (CA) 130 which may be implemented, for example, using a transimpedance amplifier. CA 130 inputs the charge signals from proof mass motion sensor pickup lines 120, 122 and outputs a voltage signal to PM Motor Controller 132 that varies as function of those charge signals. Based on the voltage signal provided by CA 130, PM Motor Controller 132 generates output signals used to control the proof masses 111 and 115 and drive them to oscillate at the mechanical resonant frequency ω of the PM sensor assembly 110. Each of the proof masses are also driven such that they oscillate 180 degrees out of phase from each other. Motor Drive Summer 134 generates two out-of-phase signals, providing that result to the motor driver 136, which generates the drive signals 140, 142 applied to each of the PM drive electrodes 112, 114.

In embodiments of the present disclosure, coupling receptor traces 150 and 155 are utilized to pick up (though capacitive coupling) a portion of one of the drive signals 140, 142 and intentionally introduce this signal into the proof mass motion sensor pickup lines 120, 122. Prior to this disclosure, incursions of the drive signal into the sensor pickup lines would have been considered "noise" that interferes with operation of PM motor control loop 135 and would delay obtaining and maintaining the proof masses 111, 115 at resonance. However, with embodiments of the present disclosure, that signal is used as a feedback coupling that counters any parasitic coupling of the drive signal onto the sensor pickup lines 120, 122 from other parasitic coupling sources. As explained in greater detail below, after fabrication of the circuit board 105 which includes system 100, coupling receptor traces 150, 155 may be "tuned" to produce a feedback coupling onto sensor pickup lines 120, 122 that is inversely identical to (or, very nearly so) any parasitically coupled signals that appear on the sensor pickup lines 120, 122. The feedback coupled signal and the net parasitically coupled signals will thus sum to zero (or near zero) on the sensor pickup lines 120, 122 so that the input into PM Motor Control Loop 135 more closely resembles the true charge signals measured by PM motion pickups 116 and 118.

In order to facilitate a controlled coupling of the drive signal onto coupling receptor traces 150, 155, a motor drive signal line 144 is tapped off of one of the drive signals 140, 142 from motor driver 136. In one embodiment, coupling receptor traces 150 and 155 are respectively run along opposite sides of a terminal portion 145 of the motor drive signal line 144 to form a capacitive coupler 158. In operation, a first potential 152 develops between coupling receptor trace 150 and motor drive signal line 144 that is a function of the coupling factor between them. Similarly, a second potential 157, opposite in polarity to the first potential 152, develops between coupling receptor trace 155 and motor drive signal line 144 that is function of the coupling factor between them. From the development of these potentials, a small capacitor is formed from coupling receptor trace 150 to coupling receptor trace 155. Variations in voltage of the motor drive signal present on motor drive signal line 144 will therefore be manifested as changes in the capacitance between the coupling receptor traces 150 and 155, and sensed as such by CA 130. Both the gain and polarity of this feedback coupling of the motor drive signal present on coupling receptor traces 150 and 155 can be controlled by adjusting the length of one of the coupling receptor traces relative to the other. That is, the degree of coupling between the traces 150 and 155 is at least in part a function of the length of the traces in the proximity of motor drive signal line 144. For example, referring to FIG. 1, if the length of coupling receptor trace 155 was trimmed at its distal end (shown at 156) which is proximate to motor drive signal 144, then the coupling of the motor drive signal onto sensor pickup line 122 would be reduced relative the coupling of the motor drive signal onto sensor pickup line 120. If instead, the length of coupling receptor trace 150 was trimmed at its distal end (shown at 151) which is proximate to motor drive signal line 144, then the coupling of the motor drive signal onto sensor pickup line 120 would be reduced relative the coupling of the motor drive signal onto sensor pickup line 122. By selectively trimming either end 151 of trace 150 or end 156 of trace 155, the capacitance applied by capacitive coupler 158 across sensor pickup line 120 and 122 can be tailored to inversely match, and thus counteract, the net parasitic coupling between the motor drive signals 140, 142 and the sensor pickup lines 120, 122 prior to input into the PM motor control loop 135. The effective removal off this parasitic noise allows the true pickup signals to be sensed at lower level and more quickly have the proof masses 111 and 115 reach resonance.

After fabrication of circuit board 105, the ends 151, 156 of traces 150, 155 should remain accessible for length adjustment as discussed above. The length of traces 150, 155 may be adjusted simply by severing a section of the trace material (either mechanically by knife, for example, or by etching or by laser) so that it is no longer electrically connected. It should be noted that in adjusting the length of the coupling receptor traces, it is not necessary to completely remove the severed trace material from the board. While one or both of the ends 151, 156 of traces 150, 155 are accessible post-fabrication (for example, on and exposed surface layer of the circuit board), the motor drive signal line 144 does not need to be as accessible. For example, in one embodiment, the terminal portion 145 of the motor drive signal line 144 is located one or more layers beneath coupling receptor traces 150, 155 and/or comprises a via connected to a lead with the drive signal 140 at some other lower layer of the circuit board 105.

Figure 1A:
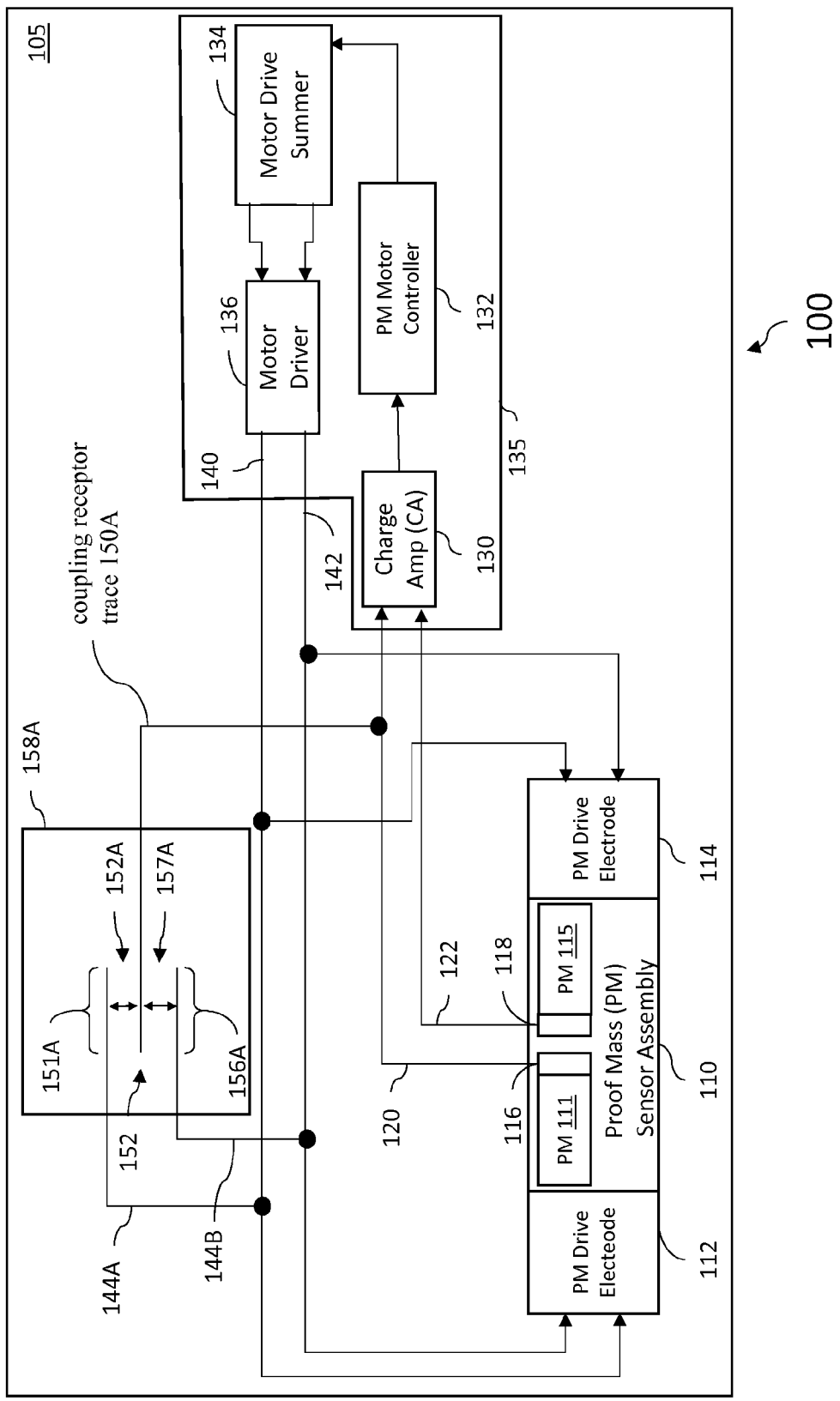
FIG. 1A is a block diagram illustrating an alternate system of one embodiment of the present disclosure.

The circuit board 105 shown in FIG. 1, includes a coupling of one noise source from one of the drive signals (i.e., drive signal 140) into capacitive coupler 158 to counter parasitic coupling in both of the proof mass motion sensor pickup lines 120 and 122. FIG. 1A provides a slightly modified alternative circuit board 105A, which is the same as circuit board 105 except that it includes a capacitive coupler 158A that picks up two noise sources (144A and 144B tapped respectively from drive signals 140 and 142) and provides a counter parasitic coupling to one of the proof mass motion sensor pickup lines 120 or 122. In one embodiment, motor drive signal line 144A and 144B are respectively run along opposite sides of a terminal portion 152 of coupling receptor trace 150A to form capacitive coupler 158A.

In operation, a first potential 152A develops between coupling receptor trace 150A and motor drive signal line 144A that is a function of the coupling factor between them. Similarly, a second potential 157A, opposite in polarity to the first potential 152A, develops between coupling receptor trace 150A and motor drive signal line 144A that is function of the coupling factor between them. From the development of these potentials, a small capacitor is formed from the motor drive signal 144A to motor drive signal 144B. Variations in voltage of the motor drive signal present on motor drive signal lines 144A and 144B will therefore be manifested as changes in the charge on coupling receptor trace 150A, and sensed as such by CA 130. Similar to FIG. 1, the degree of coupling between the drive signal lines 144A and 144B and trace 150A is at least in part a function of the length of the trace in the proximity of the two motor drive signal lines. Therefore, in the same manner as described above for FIG. 1, by selectively trimming either end 151A of line 144A or end 156A of line 144B post fabrication, the capacitance applied by capacitive coupler 158A across sensor pickup line 120 can be tailored to inversely match, and thus counteract, the net parasitic coupling between the drive signals 140, 142 and the sensor pickup lines 120, 122 prior to input into the PM motor control loop 135.

Figure 2:
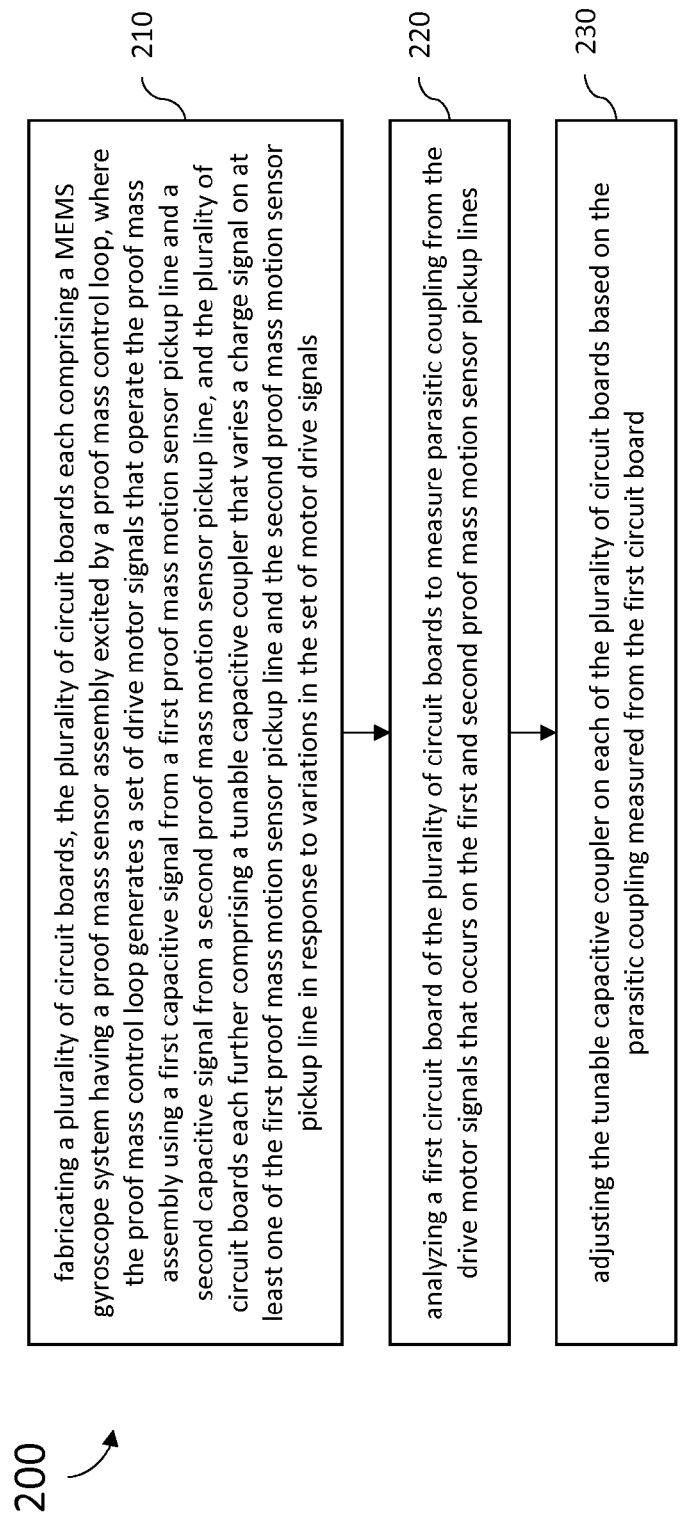
FIG. 2 is a flow chart illustrating a method of one embodiment of the present disclosure.

FIG. 2 is a flow chart illustrating a method 200 for fabricating MEMS gyroscopes of one embodiment of the present invention. In one embodiment, method 200 is implemented to produce a MEMS gyroscope system such as MEMS gyroscope system 100 described above in FIG. 1 or 1A. As such, any of the explanations, alternates embodiments or options described with respect to FIG. 1 or 1A are applicable to FIG. 2 and vice versa.

The method begins at 210 with fabricating a plurality of circuit boards, the plurality of circuit boards each comprising a MEMS gyroscope system having a proof mass sensor assembly excited by a proof mass control loop, where the proof mass control loop generates a set of motor drive signals that operate the proof mass assembly using a first capacitive signal from a first proof mass motion sensor pickup line and a second capacitive signal from a second proof mass motion sensor pickup line, and the plurality of circuit boards each further comprising a tunable capacitive coupler that varies a charge signal on at least one of the first proof mass motion sensor pickup line and the second proof mass motion sensor pickup line in response to variations in the set of motor drive signals.

The method proceeds to 220 with analyzing a first circuit board of the plurality of circuit boards to measure parasitic coupling from the drive signals that occurs on the first and second proof mass motion sensor pickup lines. This may be performed, for example, by attaching the first circuit board to test equipment configured to identify capacitive coupling of circuit board signals. As described above, the tunable capacitive coupler may be tailored to counteract a net parasitic coupling between the set of motor drive signals and the first and second sensor pickup lines prior to input into the proof mass control loop. Ideally, pre-fabrication modeling and circuit board layout designs will identify and address most sources of the parasitic coupling that might affect the inputs into the proof mass control loop and delay the proof mass sensor assembly in reaching resonance. However, do to the inherent limitations of pre-fabrication modeling and circuit board layout designs, sources of parasitic coupling may remain. Analyzing the first circuit board first identifies how much, if any, parasitic coupling remains. Analysis then proceeds to determine how the tunable capacitive coupler should be tailored to counteract the net parasitic coupling. Where the tunable capacitive coupler includes the first and second coupling receptor traces, the tailoring may involve altering the relative lengths of the traces so as to alter the degree of coupling that occurs on each lead from the motor drive signal. Analysis within block 220 may therefore be an iterative process where parasitic coupling and leads are shortened until the parasitic coupling is optimally countered by the capacitive coupler.

Each of the plurality of boards fabricated together with the first circuit board can be expected to contain the same post-fabrication sources of parasitic coupling as the first board analyzed at 220. For that reason, there is no need to perform the same analysis on each of the remaining boards. Once the needed adjustment to the coupling receptor traces for the first circuit board have been determined, the same adjustment can then be applied to the remaining boards. As such, the method proceeds to 230 with adjusting the tunable capacitive coupler on each of the plurality of circuit boards based on the parasitic coupling measured from the first circuit board.

Example Embodiments

Example 1 includes a circuit board for a micro-electromechanical (MEMS) gyroscope system, the circuit board comprising: a proof mass assembly; a proof mass control loop coupled to the proof mass assembly by a first proof mass motion sensor pickup line and a second proof mass motion sensor pickup line, where the proof mass control loop generates a set of drive signals that operate the proof mass assembly using a first capacitive signal from the first proof mass motion sensor pickup line and a second capacitive signal from the second proof mass motion sensor pickup line; and a tunable capacitive coupler connected to at least one of the first proof mass motion sensor pickup line and the second proof mass motion sensor pickup line, where the tunable capacitive coupler varies at least one of the first and second charge signals as a function of the set of drive signals.

Example 2 includes the circuit board of example 1, wherein the tunable capacitive coupler is adjusted to vary the first and second charge signals to counter at least a portion of any parasitic coupling from the set of drive signals onto the first and second proof mass motion sensor pickup lines.

Example 3 includes the circuit board of any of examples 1-2, wherein the tunable capacitive coupler is adjusted to vary one of the first and second charge signals to counter at least a portion of any parasitic coupling from the set of drive signals onto the first and second proof mass motion sensor pickup lines.

Example includes the circuit board of any of examples 1-3, wherein the proof mass assembly further comprises: a set of proof masses; a set of proof mass drive electrodes each configured to drive a respective proof mass of the set of proof masses; and a set of proof mass motion pickup sensors each configured to sense motion of the set of proof masses and generate the charge signals based on motion of the set of proof masses.

Example 5 includes the circuit board of example 4, the tunable capacitive coupler further comprising: a first coupling receptor trace, the first coupling receptor trace coupled to the first proof mass motion sensor pickup line; a second coupling receptor trace, the a second coupling receptor trace coupled the second proof mass motion sensor pickup line; and a motor drive signal line electrically connected to a first drive signal of the set of drive signals; wherein a first potential develops between the first coupling receptor trace and the motor drive signal line and a second potential, opposite in polarity to the first potential, develops between the second coupling receptor trace and the motor drive signal line; wherein variations in the first potential and the second potential produce a capacitance that varies the first and second charge signals as a function of the first drive signal.

Example 6 includes the circuit board of example 5, wherein the at least one of the first and second coupling receptor traces comprises a distal end physically accessible from a surface of the circuit board.

Example 7 includes the circuit board of any of examples 5-6, wherein the capacitance is applied by the capacitive coupler across the first and second proof mass motion sensor pickup lines and the relative lengths of the first and second coupling receptor traces are tailored to counteract a net parasitic coupling between the set of motor drive signals and the first and second sensor pickup lines prior to input into the proof mass control loop.

Example 8 includes the circuit board of example 4, the tunable capacitive coupler further comprising: a first coupling receptor trace, the first coupling receptor trace coupled to the first proof mass motion sensor pickup line; a first motor drive signal line electrically connected to a first drive signal of the set of drive signals; and a second motor drive signal line electrically connected to a second drive signal of the set of drive signals; wherein a first potential develops between the first coupling receptor trace and the first motor drive signal line and a second potential, opposite in polarity to the first potential, develops between the first coupling receptor trace and the second motor drive signal line; and wherein variations in the first potential and the second potential produce a capacitance that varies either the first charge signal or the second charge signal as a function of the first and second drive signals.

Example 9 includes the circuit board of example 8, wherein the at least one of the first and second motor drive signal lines comprises a distal end physically accessible from a surface of the circuit board.

Example 10 includes the circuit board of any of examples 8-9, wherein the capacitance is applied by the capacitive coupler to the first proof mass motion sensor pickup line and the relative lengths of the first and second motor drive signal lines are tailored to counteract a net parasitic coupling between the set of motor drive signals and the first and second sensor pickup lines prior to input into the proof mass control loop.

Example 11 includes a method comprising: fabricating a plurality of circuit boards, the plurality of circuit boards each comprising a MEMS gyroscope system having a proof mass sensor assembly excited by a proof mass control loop, where the proof mass control loop generates a set of drive signals that operate the proof mass assembly using a first capacitive signal from a first proof mass motion sensor pickup line and a second capacitive signal from a second proof mass motion sensor pickup line, and the plurality of circuit boards each further comprising a tunable capacitive coupler that varies a charge signal on at least one of the first proof mass motion sensor pickup line and the second proof mass motion sensor pickup line in response to variations in the set of drive signals; analyzing a first circuit board of the plurality of circuit boards to measure parasitic coupling from the drive signals that occurs on the first and second proof mass motion sensor pickup lines; and adjusting the tunable capacitive coupler on each of the plurality of circuit boards based on the parasitic coupling measured from the first circuit board.

Example 12 includes the method of example 11, wherein by adjusting the tunable capacitive coupler in each of the plurality of circuit boards, the tunable capacitive coupler is tailored to counteract a net parasitic coupling between the set of motor drive signals and the first and second sensor pickup lines prior to input into the proof mass control loop.

Example 13 includes the method of any of examples 11-12, wherein the proof mass assembly further comprises: a set of proof masses; a set of proof mass drive electrodes each configured to drive a respective proof mass of the set of proof masses; and a set of proof mass motion pickup sensors each configured to sense motion of the set of proof masses and generate the charge signals based on motion of the set of proof masses.

Example 14 includes the method of any of examples 11-13, the tunable capacitive coupler further comprising: a first coupling receptor trace, the first coupling receptor trace coupled to the first proof mass motion sensor pickup line; a second coupling receptor trace, the a second coupling receptor trace coupled the second proof mass motion sensor pickup line; and a motor drive signal line electrically connected to a first drive signal of the set of drive signals.

Example 15 includes the method of example 14, wherein a first potential develops between the first coupling receptor trace and the motor drive signal line and a second potential, opposite in polarity to the first potential, develops between the second coupling receptor trace and the motor drive signal line; and wherein variations in the first potential and the second potential produce a capacitance that varies the first and second charge signals as a function of the first drive signal.

Example 16 includes the method of any of examples 11-13, the tunable capacitive coupler further comprising: a first coupling receptor trace, the first coupling receptor trace coupled to the first proof mass motion sensor pickup line; a first motor drive signal line electrically connected to a first drive signal of the set of drive signals; and a second motor drive signal line electrically connected to a second drive signal of the set of drive signals.

Example 17 includes the method of example 16, wherein a first potential develops between the first coupling receptor trace and the first motor drive signal line and a second potential, opposite in polarity to the first potential, develops between the first coupling receptor trace and the second motor drive signal line; and wherein variations in the first potential and the second potential produce a capacitance that varies either the first charge signal or the second charge signal as a function of the first and second drive signals.

Example 18 includes the method of any of examples 10-17, wherein adjusting the tunable capacitive coupler comprises altering the relative lengths of a set of coupling receptor traces of the tunable capacitive coupler with respect to each other.

Example 19 includes the method of example 18, wherein altering the relative lengths comprises shorting a length of at least one trace of the tunable capacitive coupler.

Example 20 includes the method of any of examples 10-19, wherein adjusting the tunable capacitive coupler comprises at least one of applying a knife, a laser, or an etching process to at least one trace of the tunable capacitive coupler.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A circuit board for a micro-electromechanical (MEMS) gyroscope system, the circuit board comprising:
   a proof mass assembly;
   a proof mass control loop coupled to the proof mass assembly by a first proof mass motion sensor pickup line and a second proof mass motion sensor pickup line, where the proof mass control loop generates a set of drive signals that operate the proof mass assembly using a first charge signal from the first proof mass motion sensor pickup line and a second charge signal from the second proof mass motion sensor pickup line; and
   a tunable capacitive coupler connected to at least one of the first proof mass motion sensor pickup line and the second proof mass motion sensor pickup line, where the tunable capacitive coupler varies at least one of the first and second charge signals as a function of the set of drive signals;
   wherein the proof mass assembly further comprises:
     a set of proof masses;
     a set of proof mass drive electrodes each configured to drive a respective proof mass of the set of proof masses; and
     a set of proof mass motion pickup sensors each configured to sense motion of the set of proof masses and generate the charge signals based on motion of the set of proof masses;
   the tunable capacitive coupler further comprising:
     a first coupling receptor trace, the first coupling receptor trace coupled to the first proof mass motion sensor pickup line;
     a second coupling receptor trace, the second coupling receptor trace coupled the second proof mass motion sensor pickup line; and
     a motor drive signal line electrically connected to a first drive signal of the set of drive signals;
     wherein a first distal end of the first coupling receptor trace and a second distal end of the second coupling receptor trace are respectively run along opposite sides of a terminal portion of the motor drive signal line, wherein a first potential develops between the first coupling receptor trace and the motor drive signal line and a second potential, opposite in polarity to the first potential, develops between the second coupling receptor trace and the motor drive signal line; and
     wherein variations in the first potential and the second potential produce a capacitance that varies the first and second charge signals as a function of the first drive signal; and
     wherein the at least one of either the first distal end or the second distal end is physically accessible from a surface of the circuit board.

2. The circuit board of claim 1, wherein the tunable capacitive coupler is adjusted to vary the first and second charge signals to counter at least a portion of any parasitic coupling from the set of drive signals onto the first and second proof mass motion sensor pickup lines.

3. The circuit board of claim 1, wherein the tunable capacitive coupler is adjusted to vary one of the first and second charge signals to counter at least a portion of any parasitic coupling from the set of drive signals onto the first and second proof mass motion sensor pickup lines.

4. The circuit board of claim 1, wherein the capacitance is applied by the capacitive coupler across the first and second proof mass motion sensor pickup lines and the relative lengths of the first and second coupling receptor traces are tailored to counteract a net parasitic coupling between the set of motor drive signals and the first and second sensor pickup lines prior to input into the proof mass control loop.

5. A circuit board for a micro-electromechanical (MEMS) gyroscope system, the circuit board comprising:
   a proof mass assembly;
   a proof mass control loop coupled to the proof mass assembly by a first proof mass motion sensor pickup line and a second proof mass motion sensor pickup line, where the proof mass control loop generates a set of drive signals that operate the proof mass assembly using a first charge signal from the first proof mass motion sensor pickup line and a second charge signal from the second proof mass motion sensor pickup line; and
   a tunable capacitive coupler connected to at least one of the first proof mass motion sensor pickup line and the second proof mass motion sensor pickup line, where the tunable capacitive coupler varies at least one of the first and second charge signals as a function of the set of drive signals;
   wherein the proof mass assembly further comprises:
   a set of proof masses;
   a set of proof mass drive electrodes each configured to drive a respective proof mass of the set of proof masses; and
   a set of proof mass motion pickup sensors each configured to sense motion of the set of proof masses and generate the charge signals based on motion of the set of proof masses;
   the tunable capacitive coupler further comprising:
   a first coupling receptor trace, the first coupling receptor trace coupled to the first proof mass motion sensor pickup line;
   a first motor drive signal line electrically connected to a first drive signal of the set of drive signals; and
   a second motor drive signal line electrically connected to a second drive signal of the set of drive signals;
   wherein a first distal end of the first motor drive signal line and a first distal end of the second motor drive signal line are respectively run along opposite sides of a terminal portion of the first coupling receptor trace, wherein a first potential develops between the first coupling receptor trace and the first motor drive signal line and a second potential, opposite in polarity to the first potential, develops between the first coupling receptor trace and the second motor drive signal line; and
   wherein variations in the first potential and the second potential produce a capacitance that varies either the first charge signal or the second charge signal as a function of the first and second drive signals, wherein the at least one of either the first distal end or the second distal end is physically accessible from a surface of the circuit board.

6. The circuit board of claim 5, wherein the at least one of the first and second motor drive signal lines comprises a distal end physically accessible from a surface of the circuit board.

7. The circuit board of claim 5, wherein the capacitance is applied by the capacitive coupler to the first proof mass motion sensor pickup line and the relative lengths of the first and second motor drive signal lines are tailored to counteract a net parasitic coupling between the set of motor drive signals and the first and second sensor pickup lines prior to input into the proof mass control loop.

8. A method comprising:
fabricating a plurality of circuit boards, the plurality of circuit boards each comprising a MEMS gyroscope system having a proof mass assembly excited by a proof mass control loop, where the proof mass control loop generates a set of drive signals that operate the proof mass assembly using a first charge signal from a first proof mass motion sensor pickup line and a second charge signal from a second proof mass motion sensor pickup line, and the plurality of circuit boards each further comprising a tunable capacitive coupler that varies a charge signal on at least one of the first proof mass motion sensor pickup line and the second proof mass motion sensor pickup line in response to variations in the set of drive signals;
analyzing a first circuit board of the plurality of circuit boards to measure parasitic coupling from the drive signals that occurs on the first and second proof mass motion sensor pickup lines; and
adjusting the tunable capacitive coupler on each of the plurality of circuit boards based on the parasitic coupling measured from the first circuit board,
wherein the proof mass assembly further comprises:
a set of proof masses;
a set of proof mass drive electrodes each configured to drive a respective proof mass of the set of proof masses; and
a set of proof mass motion pickup sensors each configured to sense motion of the set of proof masses and generate the charge signals based on motion of the set of proof masses;
the tunable capacitive coupler further comprising:
a first coupling receptor trace, the first coupling receptor trace coupled to the first proof mass motion sensor pickup line;
a first motor drive signal line electrically connected to a first drive signal of the set of drive signals; and
a second motor drive signal line electrically connected to a second drive signal of the set of drive signals;
wherein a first distal end of the first motor drive signal line and a second distal end of the second motor drive signal line are respectively run along opposite side of a terminal portion of the first coupling receptor trace;
wherein a first potential develops between the first coupling receptor trace and the first motor drive signal line and a second potential, opposite in polarity to the first potential, develops between the first coupling receptor trace and the second motor drive signal line; and
wherein variations in the first potential and the second potential produce a capacitance that varies either the first charge signal or the second charge signal as a function of the first and second drive signals,
wherein the at least one of either the first distal end or the second distal end is physically accessible from a surface of the circuit board.

9. The method of claim 8, wherein by adjusting the tunable capacitive coupler in each of the plurality of circuit boards, the tunable capacitive coupler is tailored to counteract a net parasitic coupling between the set of motor drive signals and the first and second sensor pickup lines prior to input into the proof mass control loop.

10. The method of claim 8, wherein adjusting the tunable capacitive coupler comprises at least one of applying a knife, a laser, or an etching process to at least one trace of the tunable capacitive coupler.

11. A method comprising:
fabricating a plurality of circuit boards, the plurality of circuit boards each comprising a MEMS gyroscope system having a proof mass assembly excited by a proof mass control loop, where the proof mass control loop generates a set of drive signals that operate the proof mass assembly using a first charge signal from a first proof mass motion sensor pickup line and a second charge signal from a second proof mass motion sensor pickup line, and the plurality of circuit boards each further comprising a tunable capacitive coupler that varies a charge signal on at least one of the first proof mass motion sensor pickup line and the second proof mass motion sensor pickup line in response to variations in the set of drive signals;
analyzing a first circuit board of the plurality of circuit boards to measure parasitic coupling from the drive signals that occurs on the first and second proof mass motion sensor pickup lines; and
adjusting the tunable capacitive coupler on each of the plurality of circuit boards based on the parasitic coupling measured from the first circuit board;
wherein the proof mass assembly further comprises:
a set of proof masses;
a set of proof mass drive electrodes each configured to drive a respective proof mass of the set of proof masses; and
a set of proof mass motion pickup sensors each configured to sense motion of the set of proof masses and generate the charge signals based on motion of the set of proof masses;
the tunable capacitive coupler further comprising:
a first coupling receptor trace, the first coupling receptor trace coupled to the first proof mass motion sensor pickup line;
a second coupling receptor trace, the a second coupling receptor trace coupled the second proof mass motion sensor pickup line; and
a motor drive signal line electrically connected to a first drive signal of the set of drive signals, wherein a first distal end of the first coupling receptor trace and a second distal end of the second coupling receptor trace are respectively run along opposite side of a terminal portion of the motor drive signal line;
a second coupling receptor trace, the second coupling receptor trace coupled the second proof mass motion sensor pickup line; and
a motor drive signal line electrically connected to a first drive signal of the set of drive signals;
wherein a first distal end of the first coupling receptor trace and a second distal end of the second coupling receptor trace are respectively run along opposite sides of a terminal portion of the motor drive signal line;

wherein a first potential develops between the first coupling receptor trace and the motor drive signal line and a second potential, opposite in polarity to the first potential, develops between the second coupling receptor trace and the motor drive signal line; and wherein variations in the first potential and the second potential produce a capacitance that varies the first and second charge signals as a function of the first drive signal; and wherein the at least one of either the first distal end or the second distal end is physically accessible from a surface of the circuit board.

12. The method of claim 11, wherein adjusting the tunable capacitive coupler comprises altering the relative lengths of a set of coupling receptor traces of the tunable capacitive coupler with respect to each other.

13. The method of claim 12, wherein altering the relative lengths comprises shorting a length of at least one trace of the tunable capacitive coupler.

* * * * *

UNITED STATES PATENT AND TRADEMARK OFFICE
CERTIFICATE OF CORRECTION

PATENT NO. : 9,562,767 B2  
APPLICATION NO. : 14/458029  
DATED : February 7, 2017  
INVENTOR(S) : Weber et al.

Page 1 of 1

It is certified that error appears in the above-identified patent and that said Letters Patent is hereby corrected as shown below:

In the Specification

Column 9, Line 45, please replace "receptor trace coupled the" with --receptor trace coupled to the--.

Column 12, Line 50, please replace "receptor trace, the a second coupling" with --receptor trace, the second coupling--.

Signed and Sealed this  
Fourteenth Day of November, 2017

Joseph Matal  
*Performing the Functions and Duties of the*  
*Under Secretary of Commerce for Intellectual Property and*  
*Director of the United States Patent and Trademark Office*